United States Patent
Tucker et al.

(10) Patent No.: US 6,369,733 B1
(45) Date of Patent: Apr. 9, 2002

(54) METHOD AND SYSTEM FOR OPERATING TWO OR MORE DYNAMIC ELEMENT MATCHING (DEM) COMPONENTS WITH DIFFERENT POWER SUPPLIES FOR A DELTA-SIGMA MODULATOR OF AN ANALOG-TO-DIGITAL CONVERTER

(75) Inventors: John Christopher Tucker; Amiya Anand Chokhawala; Yuqing Yang; John Laurence Melanson, all of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/843,196

(22) Filed: Apr. 26, 2001

(51) Int. Cl.[7] ................................................. H03M 3/00

(52) U.S. Cl. ...................................... 341/143; 341/155

(58) Field of Search ........................... 341/143, 155, 341/172, 144

(56) References Cited

U.S. PATENT DOCUMENTS 5,677,618 A * 10/1997 Fiez ............................ 341/143

* cited by examiner

*Primary Examiner*—Brian Young
(74) *Attorney, Agent, or Firm*—Steven Lin, Esq.

(57) ABSTRACT

A method and system of operating dynamic element matching ("DEM") components of a DEM system with two or more power supplies are disclosed. A connection system of the DEM system is driven with one power supply operating at one voltage. Connection system couples to components that are to be matched and equalized in usage by ordering outputs to components and activating the components according to ordered outputs. A connection calculator of the DEM system is driven with another power supply operating at another voltage different from the one voltage. Connection calculator is coupled to the connection system, and connection calculator calculates an order of usage of components. A level shifter system level shifts voltage levels of signals from connection system to connection calculator, and another level shifter system level shifts voltage levels of signals from connection calculator to connection system.

28 Claims, 7 Drawing Sheets

METHOD AND SYSTEM FOR OPERATING TWO OR MORE DYNAMIC ELEMENT MATCHING (DEM) COMPONENTS WITH DIFFERENT POWER SUPPLIES FOR A DELTA-SIGMA MODULATOR OF AN ANALOG-TO-DIGITAL CONVERTER

CROSS-REFERENCED PATENT APPLICATIONS

This application relates to and cross-references U.S. patent application entitled "METHOD AND SYSTEM FOR OPERATING TWO OR MORE INTEGRATORS WITH DIFFERENT POWER SUPPLIES FOR AN ANALOG-TO-DIGITAL DELTA-SIGMA MODULATOR", (Ser. No. 09/843,393), which was contemporaneously filed on the same date as the present application. The present patent application also cross-references U.S. patent application Ser. No. 09/633,505 filed on Aug. 7, 2000 to John Melanson entitled "SECOND AND HIGHER ORDER DYNAMIC ELEMENT MATCHING IN MULTIBIT DIGITAL TO ANALOG AND ANALOG TO DIGITAL CONVERTERS" (hereafter referred to as "first DEM patent application"), which has been assigned to CIRRUS LOGIC, INC., Austin, Tex., and U.S. patent application Ser. No. 09/633,381 filed on Aug. 7, 2000 to John Melanson entitled "MULTILEVEL ANALOG TO DIGITAL DATA CONVERTER HAVING DYNAMIC ELEMENT MATCHING IN A REFERENCE PATH" (hereafter referred to as "second DEM patent application"), which has also been assigned to CIRRUS LOGIC, INC., Austin, Tex. The above patent applications are incorporated by reference herein in their entirety.

BACKGROUND OF THE INVENTION

1. Technical Field

The present invention relates in general to an analog-to-digital converter ("ADC"), and, in particular, to a modulator for an ADC. Still more particularly, the present invention relates to a method and system for operating two or more components of a dynamic element matching (DEM) system with different power supplies. The DEM system may be used in a delta-sigma modulator of an ADC.

2. Description of the Related Art

Analog-to-digital converters ("ADCs") are used to convert an analog signal to a digital signal for digital processing and/or storage. ADCs are well known in the art and are used in a variety of applications. An ADC generally has an analog system and a digital system coupled to each other. The analog system includes at least a modulator for modulating the input analog signal. The analog system processes and converts an analog input signal to a digital output signal. The digital system processes and outputs the digital signal.

The modulator may be a delta-sigma modulator, which operates to digitize an analog input signal for the ADC. A delta-sigma modulator for the ADC generally includes at least an integrator (e.g., a filter), a summation circuit, and a quantizer coupled together. The integrator performs integration operations on the input signal while the summation circuit adds the integrated signals from the integrator. Some delta-sigma modulators have multiple integrators, which provide multiple stages of integration. The quantizer operates to quantify the added outputs from the summation circuit to provide a digitized signal.

The performance of a delta-sigma ADC is sensitive to the linearity of the digital-to-analog converter ("DAC") in the delta-sigma feedback path. Errors in the feedback path are not typically shaped out of the delta-sigma loop. One approach to achieving high DAC linearity may be to use an inherently linear single bit DAC. However, single bit modulators suffer from disadvantages in the loop stability, first integrator design, tonal characteristics, and decimation filter design. Another approach may be to use a multi-bit DAC that is linearized in the signal band by dynamic element matching ("DEM"). In this other approach, digital-to-analog converter ("DAC") elements are coupled in the feedback loop between the quantizer and the summation circuit. The DAC elements operate to convert the signals back from digital signals to analog signals. Typically, each DAC element is not exactly identical in specification to the other DAC elements. For example, the capacitor or resistor values for DAC elements supposedly having the same values generally do not exactly have the same values since small variations among component values usually exist. The element mismatches that cause non-linearity are noise shaped out of the signal band. A dynamic element matching ("DEM") system is coupled in the feedback loop before the DAC elements. A DEM system changes how each element is used to represent a value in order to "noise shape" the errors caused by mismatches from the signal band. The first and second DEM patent applications, which were cross-referenced and incorporated by reference earlier, disclose exemplary DEM systems.

The DEM system is used to track, equalize, and average usage of the DAC elements to minimize the effects of the mismatched component values for the DAC elements. The DEM system also linearizes operations of the DAC elements. The DEM typically includes a connection system/box, that enables the physical connections and implementation and usage of the DAC elements, and a connection calculator, which calculates and orders which DAC elements to be used at different times. The DEM system may have a thermometer code signal (e.g., an output signal of the DEM system) that is input into the connection system/box where the input is stirred or rearranged, and the connection system/box outputs the stirred/rearranged signal to the DAC elements. The state or address of the connection system/box is determined mathematically based on a previous state and the data that is sent to a connection calculator.

Typically, a single power supply drives all components or elements of a delta-sigma modulator. For example, the same power supply would drive all of the integrators, summation circuit, quantizer, DAC elements, and the DEM system of the delta-sigma modulator. Modulator technology has developed such that a large power voltage, such as five (5) volts or higher, is able to drive the modulator. The large power voltage allows the ADC to receive and process analog input signals in a wide voltage range, which results in the ADC having a wider dynamic range and a higher signal-to-noise ratio. However, physically large components, such as large-sized transistors, are needed for the ADC to operate under the large voltage. The use of physically large components makes the size and cost of the ADC chip respectively larger and higher. Also, since a large power voltage drives the modulator components, then the ADC consumes greater overall power.

The present invention recognizes the need to maintain a large power voltage driving the delta-sigma modulator so that at least a wider dynamic range and a higher signal-to-noise ratio is provided for the ADC. Furthermore, the present invention also recognizes the continual need and desire to reduce the overall physical size, cost, and power consumption of an ADC.

SUMMARY OF THE INVENTION

A method and system of operating dynamic element matching ("DEM") components of a DEM system with two or more power supplies are disclosed. A connection system of the DEM system is driven with one power supply operating at one voltage. Connection system couples to components that are to be matched and equalized in usage by ordering outputs to components and activating the components according to ordered outputs. A connection calculator of the DEM system is driven with another power supply operating at another voltage different from the one voltage. Connection calculator is coupled to the connection system, and connection calculator calculates an order of usage of components. A level shifter system level shifts voltage levels of signals from connection system to connection calculator, and another level shifter system level shifts voltage levels of signals from connection calculator to connection system.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

A method and system for operating two or more dynamic element matching ("DEM") components with different power supplies for a modulator, such as a delta-sigma modulator, of an analog-to-digital converter ("ADC") are disclosed.

For the purposes of the present specification, a high voltage for a high supply voltage Vhv is generally five (5) volts or higher, and a low voltage for a low supply voltage Vlv is generally less than five (5) volts. The present invention, however, is not in any way limited to any high or low power supply voltage ranges, and any suitable relative levels of voltage ranges may be defined and used with the present invention.

Figure 1A:
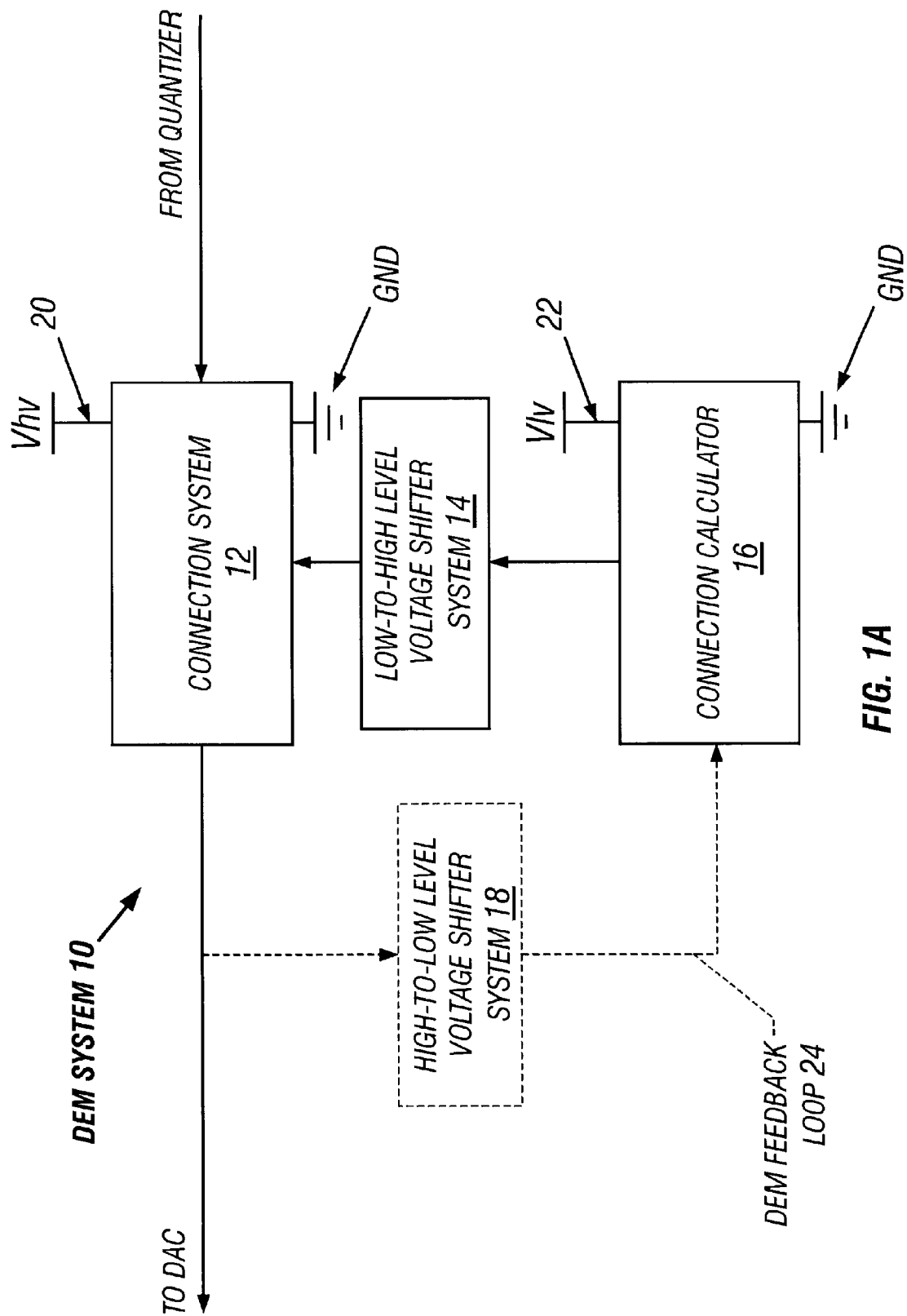
FIG. 1A is a block diagram of a generic dynamic element matching ("DEM") system in which two or more DEM components are driven by different power supplies.

With reference now to FIG. 1A, a block diagram of a generic dynamic element matching ("DEM") system 10 in which two or more DEM components are driven by different power supplies is shown. Two or more power supplies, such as power supplies 20 and 22, drive components of DEM 10. In FIG. 1A, connection system 12 is driven by power supply 20 providing a high supply voltage Vhv. Connection system 12 is also coupled to ground ("GND"). Connection calculator 16 is driven by a power supply 22 providing a low voltage supply Vlv. Connection calculator 16 is also coupled to ground ("GND"). Connection calculator 16 is operated at a different and much lower supply voltage level than connection system 12 in order to save on power consumption, size, and costs for DEM 10.

The minimal components and arrangement for DEM system 10 as shown in the solid-lined components in FIG. 1A is connection calculator 16 coupled to a low-to-high level voltage shifter system 14, and a connection system 12, in turn, coupled to low-to-high level voltage shifter system 14. Connection system 12 receives signals from a quantizer and outputs signals to components that are directed or commanded to be used, such as digital-to-analog converters ("DACs"). Connection calculator 16 generates a priority of component usage and sends the priority to connection system 12 by shifting the voltage levels between connection calculator 16 and connection system 12 from low to high by using low-to-high voltage level shifter system 14. In the minimal arrangement DEM system 10 (shown as the solid lined components in FIG. 1A), communication is sent in only one direction from connection calculator 16 to connection system 12 through low-to-high voltage shifter system 14. A DEM feedback loop 24 may also be additionally implemented for DEM system 10. As shown in the dotted-lined components of DEM system 10, DEM feedback loop 24 includes the output signal of connection system 12 being fed back to connection calculator 16 through a high-to-low level voltage shifter system 18 as shown in FIG. 1A. The present invention is not in any way limited to being used in any particular DEM system and may be used in or applied to any type of DEM system.

Figure 1B:
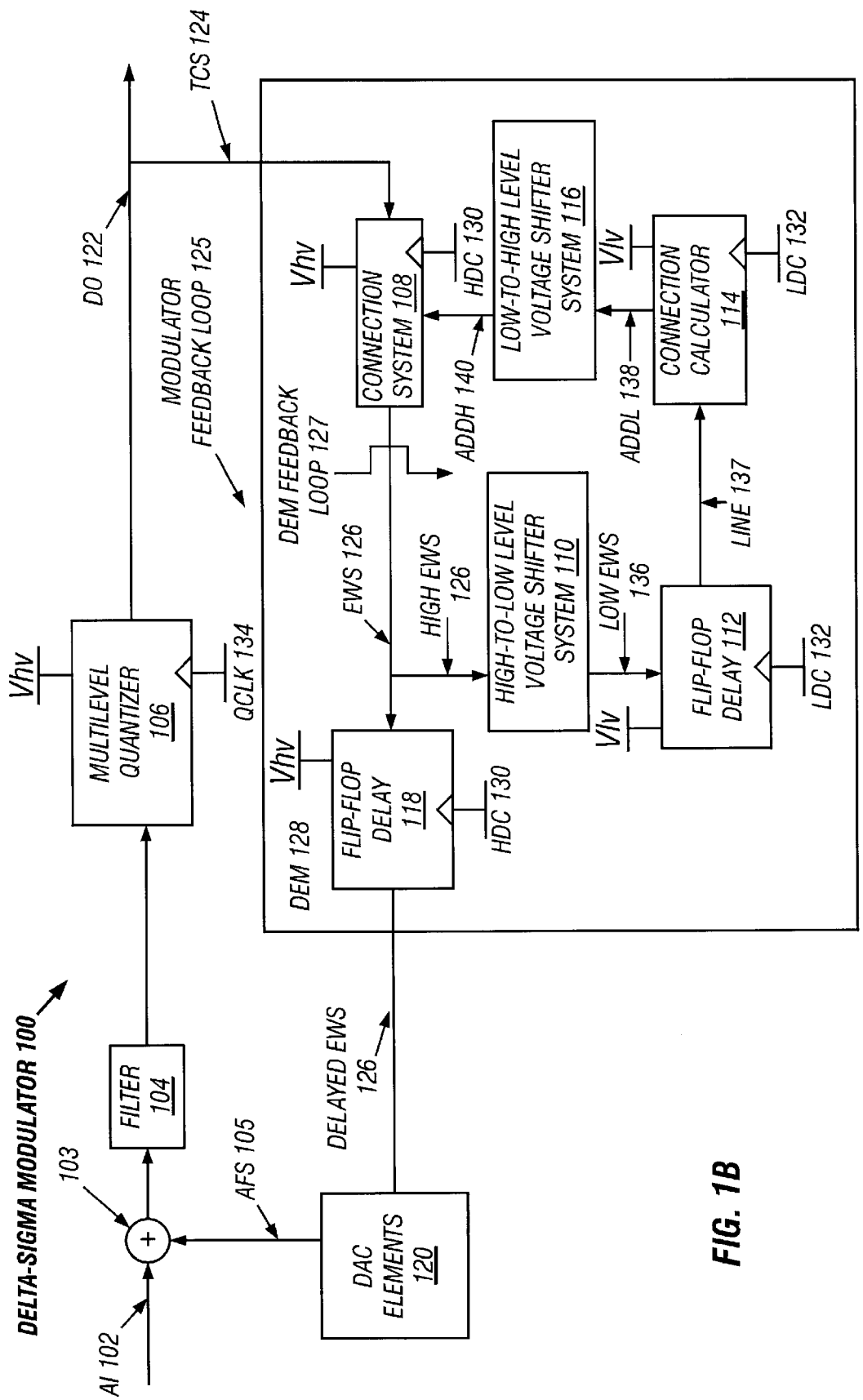
FIG. 1B is a block diagram of an exemplary delta-sigma modulator for an analog-to-digital ("ADC") implementing an exemplary DEM system in accordance with the present invention.
Figure 8:
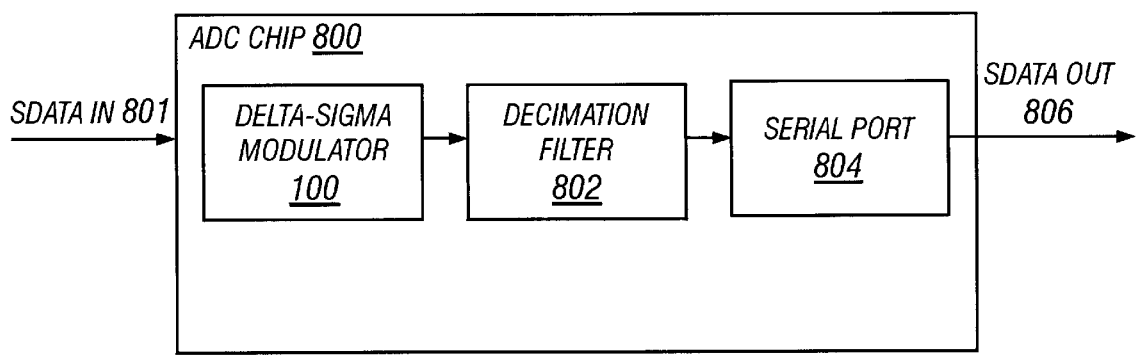
FIG. 8 is a block diagram of an exemplary ADC that incorporates the delta-sigma modulator of FIG. 1B, which implements the present invention.

With reference now to FIG. 1B, a block diagram of an exemplary delta-sigma modulator 100 for an analog-to-digital converter ("ADC"), such as an ADC chip 800 in FIG. 8, implementing an exemplary DEM system in accordance with the present invention is shown. Delta-sigma modulator 100 operates to digitize an analog input ("AI") signal 102. Delta-sigma modulator 100 includes a summation circuit 103, a filter 104, and a multi-level quantizer 106 coupled together in series. Multi-level quantizer 106 outputs a digital output ("DO") signal 122. DO signal 122 is fed back as a thermometer code signal ("TCS") 124 into a feedback loop 125. Feedback loop 125 includes a dynamic element matching ("DEM") system 128 and digital-to-analog converter ("DAC") elements 120. An input of DEM system 128 is coupled to an output of multilevel quantizer 106. DEM system 128 receives TCS 124 and tracks, calculates, and sends a delayed equal-weighted signal ("EWS") 126 to DAC elements 120. Delayed EWS 126 provides a priority order for using each of DAC elements 120 in order to equalize and average usage of DAC elements 120 to minimize effects of mismatched DAC component values and to linearize operations of DAC elements 120. DAC elements 120 convert the delayed EWS 126 back to an analog feedback signal ("AFS") 105. AFS 105 is fed back to summation circuit 103.

Summation circuit 103 adds AI signal 102 to AFS 105 from feedback loop 125. Filter 104 filters and shapes the summed signal from summation circuit 103. Filter 104 has integrators, which perform integration operations on the summed signal. Some delta-sigma modulators may have multiple integrators, which provide multiple stages of integration. Multi-level quantizer 106 operates to quantify the filtered, added outputs from filter 104 to provide a digitized signal.

As shown in FIG. 1B, DEM system 128 is coupled in feedback loop 125 before DAC elements 120. Typically, each DAC element 120 is not exactly identical in specification to other DAC elements 120. For example, the capacitor or resistor values for DAC elements 120 supposedly having the same values generally do not exactly have the same values since small variations among component values usually exist.

DEM system 128 is used to track, equalize, and average usage of DAC elements 120 to minimize the effects of the mismatched component values for DAC elements 120. DEM system 128 also linearizes operations of DAC elements 120. DAC elements 120 are coupled between DEM system 128 and summation circuit 103. DAC elements 120 operate to convert AFS 120 back from digital signals to analog signals.

In FIG. 1B, DEM system 128 has a connection system 108 and a connection calculator 114. Connection system 108 enables physical connections and implementation and usage of DAC elements 120. Connection calculator 114 calculates and orders in priority which DAC elements 120 are to be used at various sequential times. Connection system 108 and connection calculator 114 are coupled together in a DEM feedback loop 127. In DEM feedback loop 127, connection system 108 is coupled to a high-to-low level shifter system 110, and high-to-low voltage level shifter system 110 is coupled to a flip-flop delay 112, which may comprise one or more flip flops. Flip-flop delay 112 is coupled to connection calculator 114, and connection calculator 114 is coupled to a low-to-high voltage level shifter system 116. Low-to-high voltage level shifter system 116 is coupled to connection system 108. Another flip-flop delay 118, which may also comprise one or more flip flops, is coupled outside of DEM feedback loop 127 between connection system 108 and DAC elements 120.

TCS 124 (e.g., DO 122) is fed into connection system 108. Connection system 108 is initialized to select and use certain DAC elements 120 through delayed EWS 126. DAC elements 120 convert delayed EWS 126 back to AFS 105. EWS 126 is also forwarded to connection calculator 114 to further calculate and order the priority and sequence of usage of DAC elements 120. The sequential ordering is based on changing how each of DAC elements 120 is used to represent a value in order to "noise shape" the errors caused by mismatches from the band for AI 102. After connection calculator 114 determines the usage priority and sequence, connection calculator 114 sends the prioritized addresses of DAC elements 120 to connection system 108. Connection system 108, in turn, enables the physical connections, implementation, and usage of the addressed DAC elements 120. DEM feedback loop 127 appropriately and repeatedly makes such calculations and determinations throughout the operation of delta-sigma modulator 100.

Two or more power supplies drive components of DEM 128. In FIG. 1, connection system 108 is driven by a high voltage power supply providing a high supply voltage Vhv and operated by a respective high voltage DEM clock ("HDC") 130. Connection calculator 114 is driven by a low voltage power supply providing a low supply voltage Vlv and operated by a respective low voltage DEM clock ("LDC") 132. Connection calculator 114 is operated at a different and much lower supply voltage level than connection system 108 in order to save on power consumption, size, and costs for DEM 128.

However, in order to accommodate the variation in operating voltages for connection system 108 and connection calculator 114, high-to-low voltage level shifter system 110 and low-to-high voltage level shifter system 116 are utilized to level shift and scale the signals between connection system 108 and connection calculator 114 to the appropriate voltage levels. High-to-low voltage level shifter system 110 is coupled between connection system 108 and flip-flop delay 112, which, in turn, is coupled to connection calculator 114. High-to-low voltage level shifter system 110 receives the "high" EWS 126 from connection system 108 and shifts the voltage level of the "high" EWS 126 to a respective "low" EWS 136. For example, if the high voltage level for high EWS 126 is 16 volts and the low voltage level for low EWS 136 needs to be 3.3 volts, then high-to-low voltage level shifter system 110 shifts and scales the 16 volt level of high EWS 126 to the 3.3 volt level of low EWS 136. Flip-flop delay 112 delays low EWS 136 being sent to connection calculator 114 through line 137. The delay by flip-flop 112 ensures connection calculator 114 properly processing EWS 136.

Connection calculator 114 receives the delayed EWS 136 from flip-flop delay 112. Connection calculator 114 generates the addresses for DAC elements 120 that are to be used in a particular priority and sends the addresses through a low address signal ("ADDL") 138 to low-to-high voltage level shifter system 116. Low-to-high voltage level shifter system 116 shifts the voltage level of ADDL 138 to a respective high address signal ("ADDH") 140. For example, if the voltage level for ADDL 138 is 3.3 volts and the voltage level for ADDH 140 needs to be 16 volts, then low-to-high voltage level shifter system 116 shifts and scales the 3.3 volt level of ADDL 138 to the 16 volt level of ADDH 140. Connection system 108 appropriately stirs and rearranges the order of DAC elements 120 and sends the prioritized and updated EWS 126 to flip-flop delay 118. Flip-flop delay 118 delays EWS 126 being sent from connection system 108 to DAC elements 120. The delay by flip-flop 118 ensures DAC elements 120 properly receiving and processing EWS 126 in which respective DAC elements 120 are used in accordance to the sequential order determined by connection calculator 114.

Since two or more power supplies (e.g., power supplies that provide supply voltages Vhv and Vlv) are utilized in DEM 128, synchronization of the two or more respective clock signals HDC 130 and LDC 132 need to be maintained in order for delta-sigma modulator 100 to properly operate. Flip-flop delay 118 is located outside of DEM feedback loop 127 instead of inside DEM feedback loop 127 to ensure that LDC 132 remains faster than (e.g., "beats faster than") HDC 130. Otherwise, if HDC 130 were to race ahead of LDC 132, such as in the instance where flip-flop delay 118 were located within DEM feedback loop 127, then, during the operation of DEM 128, the data from TCS 124 would race past LDC 132. To avoid the synchronization problem of the signals, flip-flop delay 112 is located within DEM feedback loop 127 while flip-flop delay 118 is located outside of DEM feedback loop 127.

Figure 2:
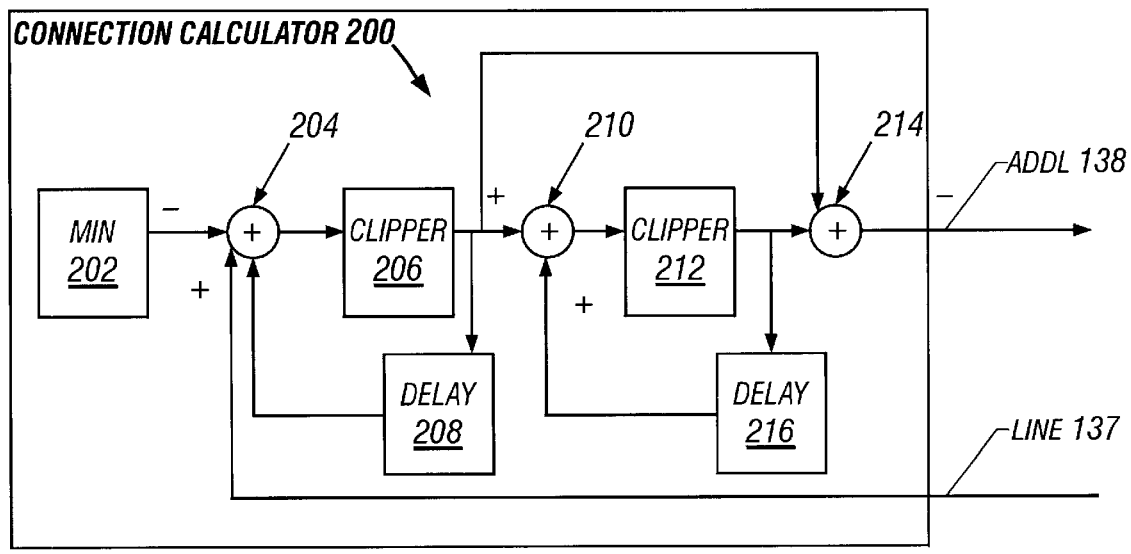
FIG. 2 is a first exemplary connection calculator for the DEM system in FIG. 1B.

Referring now to FIG. 2, a first exemplary connection calculator 200 for connection calculator 114 of FIG. 1 is shown. Exemplary connection calculator 200 is a noise-shaping element usage circuitry (e.g., a noise shaper) that is utilized at the location of connection calculator 114 in delta-sigma modulator 100. Usage of DAC elements 120 is noise-shaped by connection system 108, which may be a vector quantizer, and by one or more connection calculator (s) 200. Initial delay 112 is coupled before connection calculator 200. Delay 112 provides one or more single bit output(s). Delay 112 provides one output for each connection calculator 200. Connection calculator 200 includes two cascaded integrators coupled together in the manner shown in FIG. 2. One integrator has a summer 204, a clipper 206, and a delay 208, and another integrator has a summer 210, a clipper 212, and a delay 216. The two integrators noise-shape the received EWS 136 through line 137 and output respective ADDLs 138. Minimizer ("MIN") block 202 bounds the loop(s) of connection calculator(s) 200. Clippers 206 and 212 perform clipping operations as necessary. The output of clipper 206 is fed forward to adder 214. Connection system 108 selects the lowest numeric values among the input data from TCS 124. When clipping occurs, connection calculator 200 exhibits improved behavioral characteristics since the state of the first integrator is not significantly affected and degraded by the clipping. Word lengths may be selected so that clipping rarely occurs in the first integrator. This selection of word length guarantees that at least first order noise shaping is preserved when high input levels are present. Connection calculator 200 exhibits improved behavior since the two integrals for the two integrators are separately clipped instead of clipping one value that carries both pieces of information.

Connection calculator 200 may further be improved by making the relative gain of the two integrators, as presented to connection system 108, variable. For example, the gain of the first integrator may be made equal to one, and the gain of the second integrator may be made equal to variable gain "g". The variable gain is an improvement since connection system 108 is accounted for as an additive noise source. If variable gain "g" is made equal to 0.5, an additional improvement of ten (10) decibels (dB) for high signals results. A small improvement also results for low input signal levels. A connection calculator may remain for relatively long periods in a state in which the connection calculator is unable to make the proper decisions, and the connection calculator moves further away from a well-balanced state of operation. Variably increasing the gain of the first integrator relative to the second integrator provides an improved pull-back to the balanced state and better performance.

Figure 3:
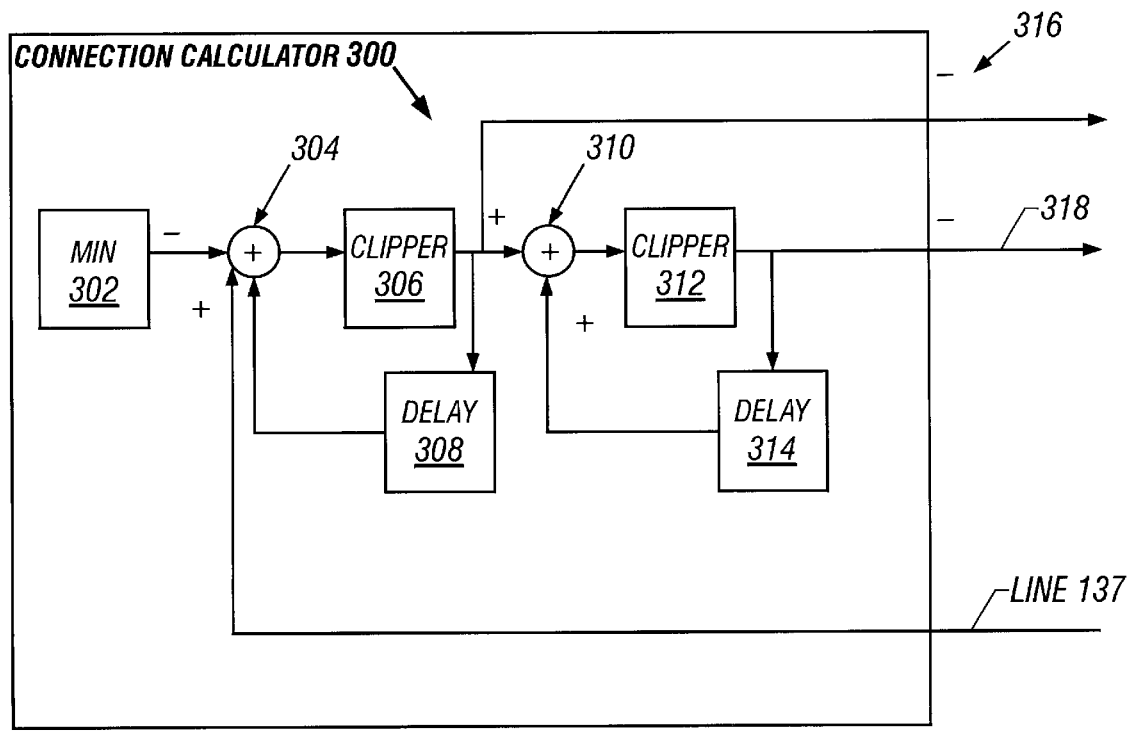
FIG. 3 is a second exemplary connection calculator for the DEM system in FIG. 1B.

With reference now to FIG. 3, a second exemplary connection calculator 300 for connection calculator 114 of FIG. 1 is shown. Exemplary connection calculator 300 is a noise-shaping element usage circuitry (e.g., a noise shaper) that is utilized at the location of connection calculator 114 in delta-sigma modulator 100. Usage of DAC elements 120 is noise-shaped by connection system 108, which may be a vector quantizer, and by one or more connection calculator (s) 300. Initial delay 112 is coupled before connection calculator 300. Delay 112 provides one or more single bit output(s). Delay 112 provides one output for each connection calculator 300. Minimizer ("MIN") block 302 bounds the loop(s) of connection calculator(s) 300. Connection calculator 300 includes two cascaded integrators coupled together in the manner shown in FIG. 3. One integrator has a summer 304, a clipper 306, and a delay 308, and another integrator has a summer 310, a clipper 312, and a delay 314. Clippers 306 and 312 perform clipping operations as necessary. The two integrators noise-shape the received EWS 136 through line 137. Connection calculator 300 generates two output signals, a first integral signal 316 and a second integral signal 318. Both integral signals 316 and 318 are inputs to connection system 108.

Connection system 108 sorts with first priority on integral signal 316 and with second priority on integral signal 318. The prioritization of integral signals 316 and 318 is equivalent to making the gain of the second integrator arbitrarily small. For example, the rules for connection system 108 are generally as follows:

1. DAC elements 120 designated with the lowest values in first integral signal 316 are first selected for use.

If a tie exists between two or more lowest values in first integral signal 316, then DAC elements 120 designated with the lowest values in second integral signal 318 are then chosen for use.

The prioritization scheme is equivalent to a binary comparison in which the first integral signal 316 is used for the high order bits and the second integral signal 318 is used for the low order bits. Connection calculator 300 is a rule-based noise shaper in which the rule is to select DAC elements 120 based on priorities of usage calculated by connection calculators 300. As the primary selection criteria, DAC elements 120 that have been used the least (e.g., first integral) are first selected. As the secondary selection criteria, DAC elements 120 that have the lowest integral of the usage (e.g., second integral) are then selected.

Figure 4:
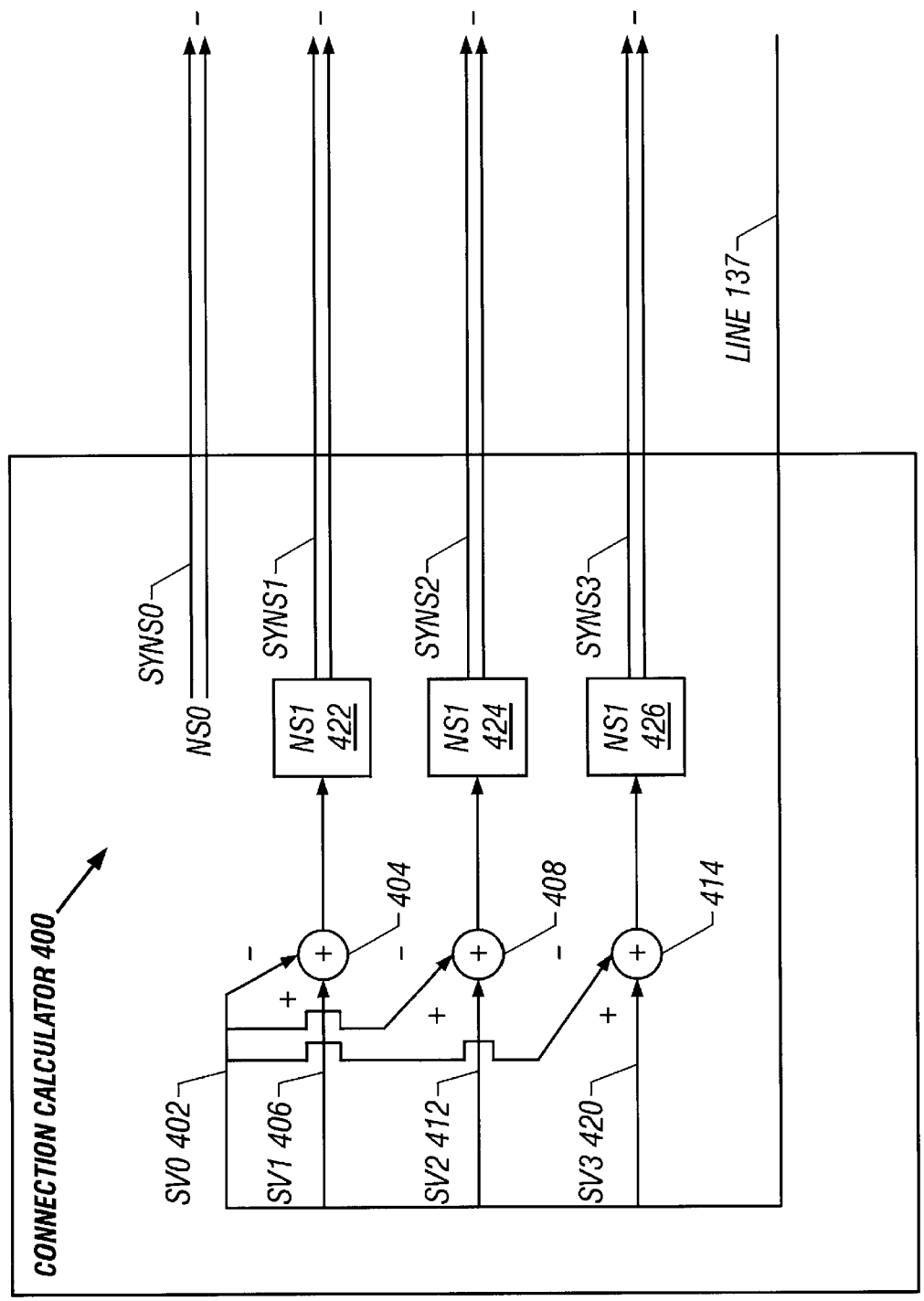
FIG. 4 is a third exemplary connection calculator for the DEM system in FIG. 1B.

Referring now to FIG. 4, a third exemplary connection calculator 400 for connection calculator 114 of FIG. 1 is shown. Exemplary connection calculator 400 is a noise-shaping element usage circuitry (e.g., a noise shaper) that is utilized at the location of connection calculator 114 in delta-sigma modulator 100. Usage of DAC elements 120 is noise-shaped by connection system 108, which may be a vector quantizer, and by one or more connection calculator (s) 400. Initial delay 112 is coupled before connection calculator 400. Delay 112 provides one or more single bit output(s). Delay 112 provides one output for each connection calculator 400. Connection calculator 400 prioritizes utilization of four DAC elements 120, and connection calculator 400 has three sub-systems, which are connection calculators or noise shapers ("NS1", "NS2", and "NS3") 422, 424, and 426. The zero noise shaper ("NS0") always outputs a zero value, and input SYNS0 is therefore always set to a zero (0) value. All of the outputs are used only in a relative sense, and one output can arbitrarily be designated as zero (0) and the other outputs made relative to the zero value. The feedback value ("SV0") 402 for NS0 is therefore subtracted from the input to NS1 422, NS2, 424, and NS3 426. NS1 422, NS2, 424, and NS3 426 may be a connection calculator 200 or 300. The first integrator for each connection calculator or noise shaper is tightly bounded.

With rule-based noise shaping, the first integrator only takes on the values of −1, 0, and +1. The first clipper of the connection calculator or noise shaper is not needed, and the second integrator of the connection calculator or noise shaper is then only an up/down counter. One fewer shaping element is required for a given order of noise shaping in a connection calculator or noise shaper. In FIG. 4, connection system 108 receives four (4) inputs SYNS0, SYNS1, SYNS2, and SYNS3, one input from each connection calculator or noise shaper. If rule-based ordering is utilized, connection system 108 would receive eight (8) inputs as reflected by the input lines in FIG. 4. The hardware for connection system 108 may be simplified since some of the comparisons are against zero (0), which is a very simple case to implement. In the illustrated case, six (6) full comparisons (0:1; 0:2; 0:3; 1:2; 1:3; 2:3) are replaced with three full comparisons and three comparisons against zero (0) which reduces the hardware for connection system 108 by nearly a factor of two (2).

Figure 5:
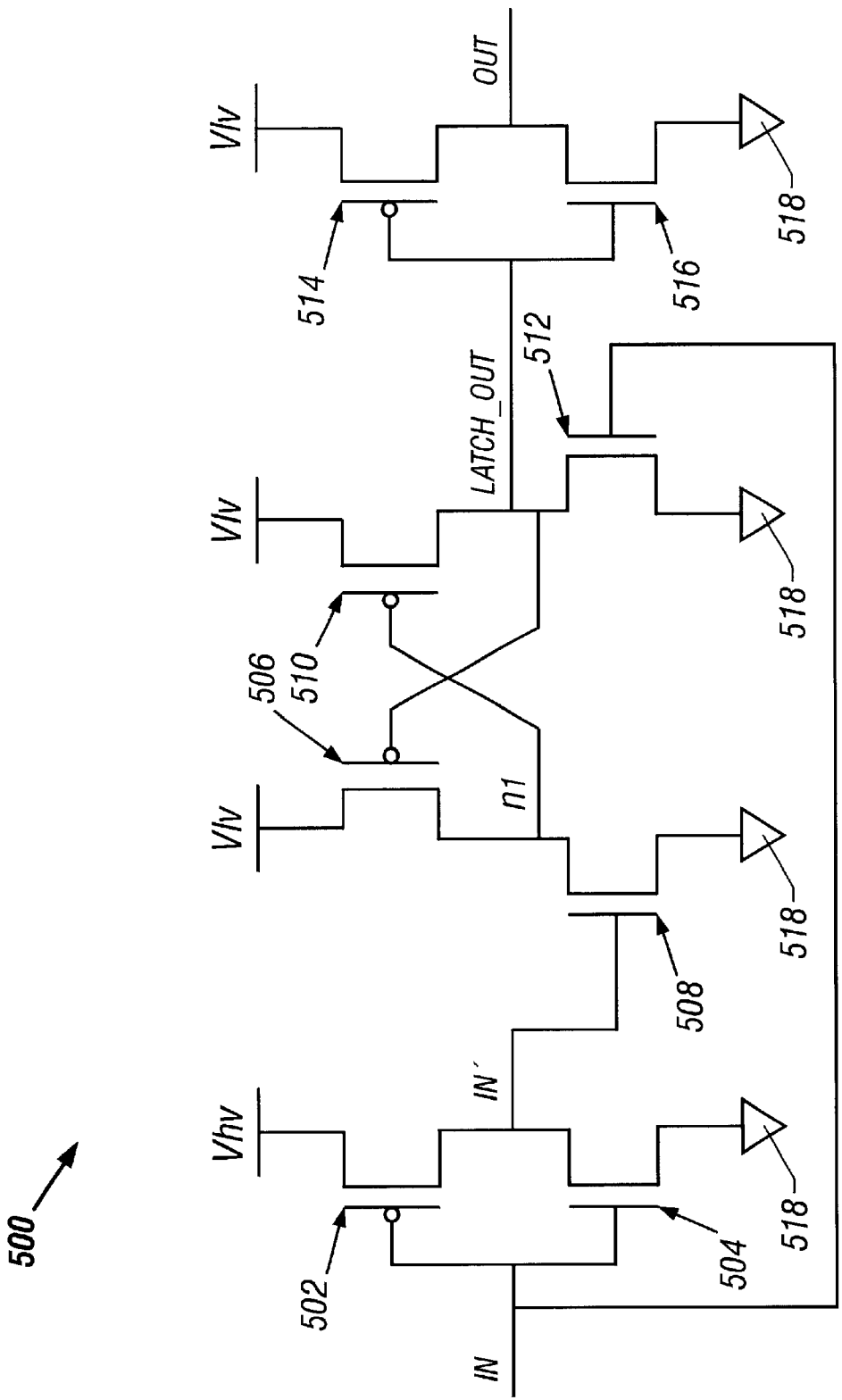
FIG. 5 is an exemplary high-to-low voltage level shifter for the DEM system in FIG. 1B.

With reference now to FIG. 5, an exemplary high-to-low voltage level shifter 500 for the delta-sigma modulator 100 of FIG. 1 is shown. Level shifter 500 has an input inverter, which includes metal-oxide silicon, field-effect-transistors ("MOSFETs") 502 and 504, which are high-voltage ("HV") MOSFETs coupled in the manner shown in FIG. 5. The input inverter is coupled to voltage Vhv and ground 518 as shown in FIG. 5. The input inverter inverts the "in" signal to an "in" signal. Level shifter 500 also has a cross-coupled latch, which includes low voltage ("LV") MOSFETs 506 and 510 and HV MOSFETs 508 and 512 coupled in the manner shown in FIG. 5. MOSFETs 508 and 512 are HV MOSFETs since high-voltages drive their gates. The cross-coupled latch is coupled to voltage Vlv and ground 518 as shown in FIG. 5. The cross-coupled latch senses the logic level of the "in" signal and creates the corresponding low voltage ("LV") "out" signal. The latch works on positive feedback. Level shifter 500 further comprises another inverter, which includes MOSFETs 514 and 516 coupled in the manner shown in FIG. 5. This other inverter is coupled to voltage Vlv and ground 518 as shown in FIG. 5.

For example, in FIG. 5, if the "in" signal is a high value that is signified by 16 volts, MOSFET 508 is turned off and MOSFET 512 is turned on. MOSFET 512 pulls a latch output ("latch_out") signal down turning on MOSFET 506. Node "n1" is raised in voltage level, and MOSFET 510 is turned off allowing MOSFET 512 to pull latch_out signal all the way to a low zero (0) value. Latch_out signal is then inverted by the other inverter, which includes MOSFETs 514 and 516. This other inverter provides a high value signified by 2.2 volts for the "out" signal. On the other hand, if the "in" signal is a low value that is signified by zero (0) volts, then MOSFET 508 is turned on and MOSFET 512 is turned off. MOSFET 508 pulls node "n1" lower turning on MOSFET 510. The voltage level at the node with the latch_out signal is increased. MOSFET 506 is then turned off allowing MOSFET 508 to pull the node "n1" all the way to zero (0). Since MOSFET 510 is on and MOSFET 512 is off, the "latch_out" signal is pulled all the way up to 3.3 volts. The "latch_out" signal is then inverted by the other inverter that includes MOSFETs 514 and 516. This other inverter then provides a low value signified by zero (0) volts for the "out" signal.

Figure 6:
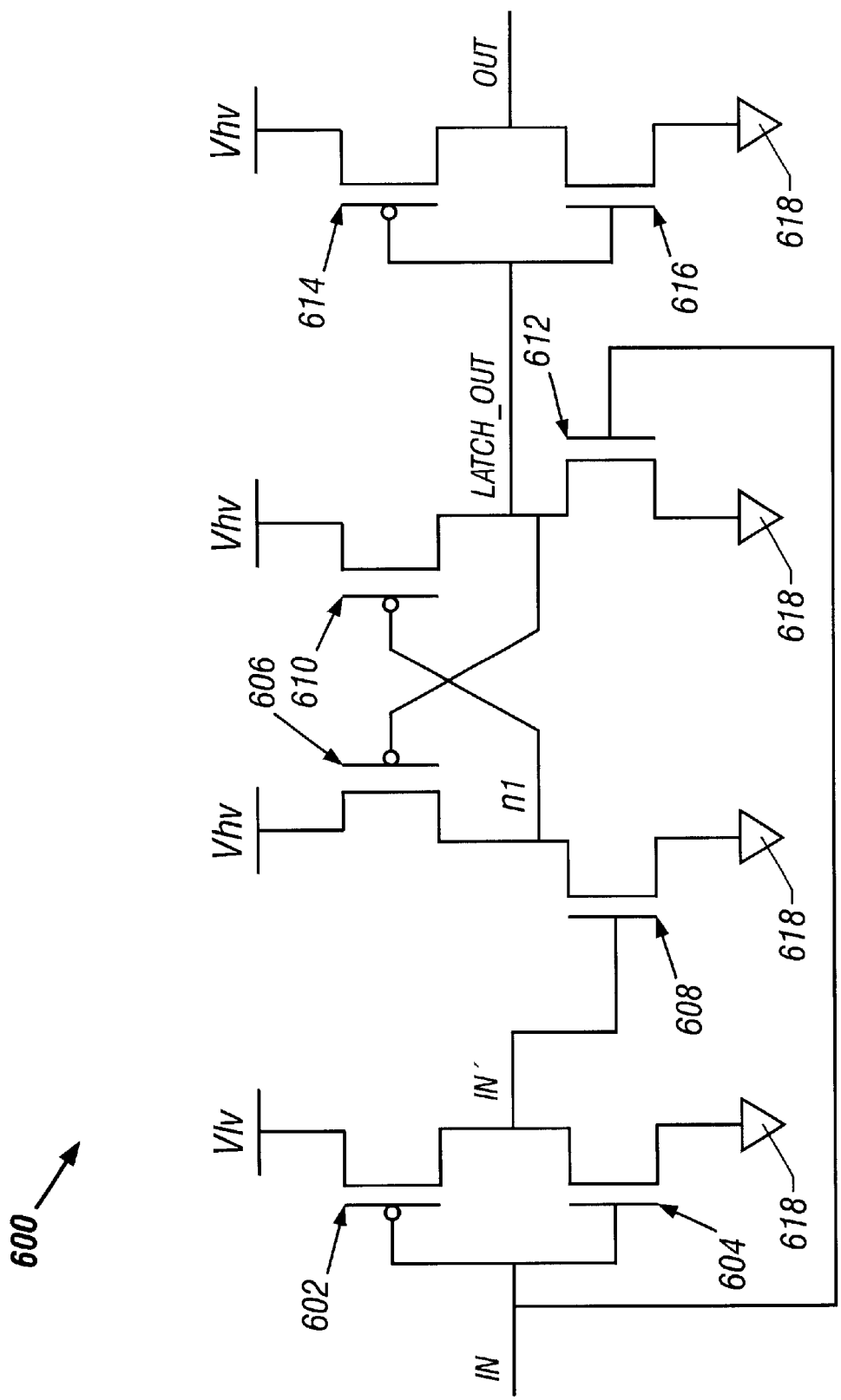
FIG. 6 is an exemplary low-to-high voltage level shifter for the DEM system in FIG. 1B.

With reference now to FIG. 6, an exemplary low-to-high voltage level shifter 600 for the delta-sigma modulator 100 of FIG. 1 is shown. Level shifter 600 has an input inverter, which includes MOSFETs 602 and 604, which are LV MOSFETs coupled in the manner shown in FIG. 6. The input inverter is coupled to voltage Vlv and ground 618 as shown in FIG. 6. The input inverter inverts the "in" signal to an "in" signal. Level shifter 600 also has a cross-coupled latch, which includes HV MOSFETs 606, 608, 610, and 612 coupled in the manner shown in FIG. 6. Cross-coupled latch is coupled to voltage Vhv and ground 618 as shown in FIG. 6. MOSFETs 606, 608, 610, and 612 are HV MOSFETs since they are driven by high-voltages. The cross-coupled latch senses the logic level of the "in" signal and creates the corresponding high voltage ("HV") "out" signal. The latch works on positive feedback. Level shifter 600 further comprises another inverter, which includes MOSFETs 614 and 616 coupled in the manner shown in FIG. 6. The other inverter is also coupled to voltage Vhv and ground 618 as shown in FIG. 6.

For example, in FIG. 6, if the "in" signal is a high value that is signified by 3.3 volts, MOSFET 608 is turned off and MOSFET 612 is turned on. MOSFET 612 pulls a latch output ("latch_out") signal down turning on MOSFET 606. Node "n1" is raised in voltage level, and MOSFET 610 is turned off allowing MOSFET 612 to pull latch_out signal all the way to a low zero (0) value. Latch_out signal is then inverted by the other inverter, which includes MOSFETs 614 and 616. This other inverter provides a high value signified by 16 volts for the "out" signal. On the other hand, if the "in" signal is a low value that is signified by zero (0) volts, then MOSFET 608 is turned on and MOSFET 612 is turned off. MOSFET 608 pulls node "n1" lower turning on MOSFET 610. The voltage level at the node with the latch_out signal is increased. MOSFET 606 is then turned off allowing MOSFET 608 to pull the node "n1" all the way to 16 volts. Since MOSFET 610 is on and MOSFET 612 is off, the "latch_out" signal is pulled all the way up to 16 volts. The "latch_out" signal is then inverted by the other inverter that includes MOSFETs 614 and 616. This other inverter then provides a low value signified by zero (0) volts for the "out" signal.

Figure 7:
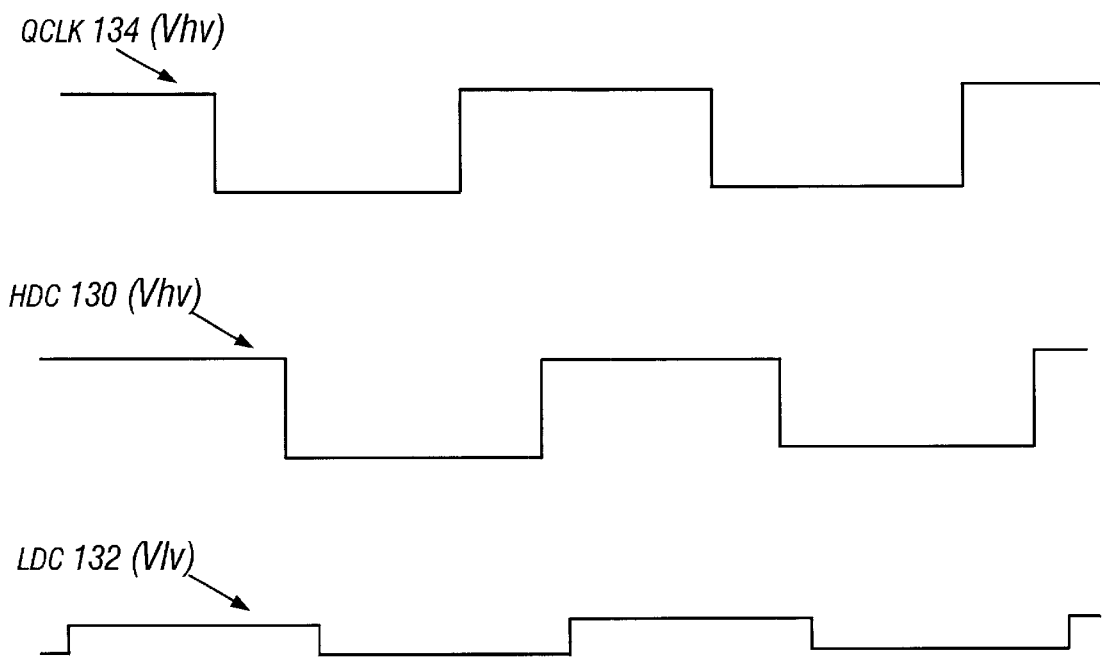
FIG. 7 are an exemplary quantizer clock signal, an exemplary high voltage DEM clock signal, and an exemplary low voltage DEM clock signal, which are shown with respect to each other in accordance with the present invention.

Referring now to FIG. 7, an exemplary quantizer clock signal ("QCLK") 134, an exemplary high voltage DEM clock signal 130, and an exemplary low voltage DEM clock signal 132 are shown with respect to each other in accordance with the present invention. QCLK 134 is at a high voltage level Vhv. HDC 130 is also at a high voltage level Vhv and lags by a delay time behind QCLK 134. LDC 132 is level shifted and scaled to an appropriate low voltage Vlv. LDC 132 lags by a delay time behind HDC 130.

With reference now to FIG. 8, a block diagram of an exemplary ADC chip 800 that incorporates delta-sigma modulator 100 of FIG. 1 is shown. ADC chip 800 includes delta-sigma modulator 100 serially coupled to a decimation filter 802. Decimation filter 802, in turn, is serially coupled to a serial port 804. A serial-data input ("SDATA IN") signal 801 is inputted into delta-sigma modulator 100 of ADC chip 800. Delta-sigma modulator 100 digitizes SDATA IN signal 801 and outputs the digitized signal to decimation filter 802. Decimation filter 802 receives, down-samples, and filters the digitized signal received from modulator 100 and outputs the down-sampled signal to serial port 804. Serial port 804 is typically an interface for ADC chip 800 to other components or devices. The down-sampled signal is outputted as a serial-data output ("SDATA OUT") signal 806 from serial port 804. ADC chip 800 with modulator 100 may be used in various applications such as analog-to-digital conversion in audio applications, recording studio equipment, temperature sensing devices, measuring instruments, telecommunication systems and devices, and any other suitable applications.

The present invention discloses a DEM system having components and sub-systems operated by two or more power supplies. By operating on two or more power supplies, the present DEM system allows one of the power supplies to provide a large power voltage to drive the delta-sigma modulator so that at least a wider dynamic range and a higher signal-to-noise ratio is provided for the ADC. By operating the DEM system with at least both high and low power supplies, the present DEM system also reduces the overall power consumption for an ADC and also reduces the physical size and cost of an ADC.

The present invention is not in any way limited to being utilized with a specific DEM, modulator, ADC, or applications, and the present invention may also be used for any other suitable devices, components, or systems and utilized for any suitable application.

While the invention has been particularly shown and described with reference to a preferred embodiment, it will be understood by those skilled in the art that various changes in form and detail may be made therein without departing from the spirit and scope of the invention.

What is claimed is:

1. A dynamic element matching (DEM) system for matching and equalizing usage of components for a system, comprising:

a connection calculator that calculates an order of usage of components and is driven by a power supply operating at one voltage;

a connection system coupled to the connection calculator wherein the connection system is able to couple to the components that are to be matched and equalized in usage by ordering outputs to the components and activating the components according to the ordered outputs wherein the connection system is driven by another power supply operating at another voltage; and a level shifter system coupled between the connection calculator and the connection system wherein the level shifter system shifts voltage levels of signals from the connection calculator to the connection system.

2. The DEM system according to claim 1, further comprising:

another level shifter system coupled between the connection system and the connection calculator wherein the another level shifter system shifts voltage levels of signals from the connection system to the connection calculator.

3. The DEM system according to claim 2, wherein the connection system, the connection calculator, the level shifter system, and the another level shifter system are coupled in a DEM feedback loop system.

4. The DEM system according to claim 3, further comprising:

a delay component coupled within the DEM feedback loop system between the another level shifter system and the connection calculator wherein the delay component delays the signals between the another level shifter system and the connection calculator; and another delay component coupled outside of the DEM feedback loop system to the connection system and the components wherein the another delay delays the signals to the components.

5. The DEM system according to claim 2, wherein:

the one power supply is a low-voltage power supply;

the one voltage is a low voltage;

the another power supply is a high-voltage power supply;

the another voltage is a high voltage;

the level shifter system is a low-to-high voltage level shifter system; and the another level shifter system is a high-to-low voltage level shifter system.

6. The DEM system according to claim 5, wherein the high-to-low voltage level shifter system further comprises:

a set of transistors operated at the high voltage wherein the set of transistors drives down the voltage levels of the signals;

at least another set of transistors coupled to the set of transistors wherein the at least another set of transistors drives down the voltage levels of the signals and is operated at the low voltage; and wherein the signals are bound to operationally decrease to the low voltage.

7. The DEM system according to claim 5, wherein the low-to-high voltage level shifter system further comprises:

a set of transistors operated at the low voltage wherein the set of transistors drives up the voltage levels of the signals;

at least another set of transistors coupled to the set of transistors wherein the at least another set of transistors drives up the voltage levels of the signals and is operated at the high voltage; and wherein the signals are free to operationally increase to the high voltage.

8. The DEM system according to claim 1, wherein the connection calculator is at least one connection calculator each further comprising a first integrator receiving and integrating an input signal from the level shifter system and sending a first integrated output signal;

a second integrator receiving and integrating the first integrated output signal and the second integrator clipping the integrated signal to form a second integrated output signal; and a summation system for receiving and adding the first integrated output signal and the second integrated output signal to form the order of the usage of the components.

9. The DEM system according to claim 8, wherein the first integrator and the second integrator separately clip the input signal.

10. The DEM system according to claim 8, wherein the connection calculator is a rule-based connection calculator in which lowest values from the first integrated output signal are first designated in the order of the usage of the components and lowest values from the second integrated output signal are secondly designated in the order of the usage of the components.

11. A modulator for an analog-to-digital converter ("ADC"), comprising:

a summation circuit that receives an input signal and an analog feedback signal;

a filter coupled to the summation circuit for filtering an added signal from the summation circuit; and a quantizer coupled to the filter for quantifying the filtered, added signal into a digitized signal that is outputted as a digital output signal and fed back to the summation circuit through a feedback loop having a dynamic element matching ("DEM") system and digital-to-analog elements coupled together; and wherein the DEM system matches and equalizes usage of the DAC elements and comprises:

a connection calculator that calculates an order of usage of components and is driven by a power supply operating at one voltage;

a connection system coupled to the connection calculator wherein the connection system is able to couple to the components that are to be matched and equalized in usage by ordering outputs to the components and activating the components according to the ordered outputs wherein the connection system is driven by another power supply operating at another voltage; and a level shifter system coupled between the connection calculator and the connection system wherein the level shifter system shifts voltage levels of signals from the connection calculator to the connection system.

12. The modulator according to claim 11, further comprising:
another level shifter system coupled between the connection system and the connection calculator wherein the another level shifter system shifts voltage levels of signals from the connection system to the connection calculator.

13. The modulator according to claim 12, wherein the connection system, the connection calculator, the level shifter system, and the another level shifter system are coupled in a DEM feedback loop system.

14. The modulator according to claim 13, further comprising:
a delay component coupled within the DEM feedback loop system between the another level shifter system and the connection calculator wherein the delay component delays the signals between the another level shifter system and the connection calculator; and
another delay component coupled outside of the DEM feedback loop system to the connection system and the components wherein the another delay delays the signals to the components.

15. The modulator according to claim 12, wherein:
the one power supply is a low-voltage power supply;
the one voltage is a low voltage;
the another power supply is a high-voltage power supply;
the another voltage is a high voltage;
the level shifter system is a low-to-high voltage level shifter system; and
the another level shifter system is a high-to-low voltage level shifter system.

16. The modulator according to claim 11, wherein the connection calculator is at least one connection calculator each further comprising
a first integrator receiving and integrating an input signal from the level shifter system and sending a first integrated output signal;
a second integrator receiving and integrating the first integrated output signal and the second integrator clipping the integrated signal to form a second integrated output signal; and
a summation system for receiving and adding the first integrated output signal and the second integrated output signal to form the order of the usage of the components.

17. The modulator according to claim 16, wherein the first integrator and the second integrator separately clip the input signal.

18. The modulator according to claim 16, wherein the connection calculator is a rule-based connection calculator in which lowest values from the first integrated output signal are first designated in the order of the usage of the components and lowest values from the second integrated output signal are secondly designated in the order of the usage of the components.

19. An analog-to-digital converter ("ADC") chip, comprising: at least one modulator each having:
a summation circuit that receives an input signal and an analog feedback signal;
a filter coupled to the summation circuit for filtering an added signal from the summation circuit; and
a quantizer coupled to the filter for quantifying the filtered, added signal into a digitized signal that is outputted as a digital output signal and fed back to the summation circuit through a feedback loop having a dynamic element matching ("DEM") system and digital-to-analog elements coupled together; and
wherein the DEM system matches and equalizes usage of the DAC elements and comprises:
a connection calculator that calculates an order of usage of components and is driven by a power supply operating at one voltage;
a connection system coupled to the connection calculator wherein the connection system is able to couple to the components that are to be matched and equalized in usage by ordering outputs to the components and activating the components according to the ordered outputs wherein the connection system is driven by another power supply operating at another voltage; and
a level shifter system coupled between the connection calculator and the connection system wherein the level shifter system shifts voltage levels of signals from the connection calculator to the connection system; and
at least one decimation filter coupled to the at least one modulator for down-sampling and filtering an oversampled signal portion from the digitized signal.

20. The ADC chip according to claim 19, further comprising:
another level shifter system coupled between the connection system and the connection calculator wherein the another level shifter system shifts voltage levels of signals from the connection system to the connection calculator.

21. The ADC chip according to claim 20, wherein the connection system, the connection calculator, the level shifter system, and the another level shifter system are coupled in a DEM feedback loop system.

22. The ADC chip according to claim 21, further comprising:
a delay component coupled within the DEM feedback loop system between the another level shifter system and the connection calculator wherein the delay component delays the signals between the another level shifter system and the connection calculator; and
another delay component coupled outside of the DEM feedback loop system to the connection system and the components wherein the another delay delays the signals to the components.

23. The ADC chip according to claim 20, wherein:
the one power supply is a low-voltage power supply;
the one voltage is a low voltage;
the another power supply is a high-voltage power supply;
the another voltage is a high voltage;
the level shifter system is a low-to-high voltage level shifter system; and
the another level shifter system is a high-to-low voltage level shifter system.

24. The ADC chip according to claim 19, wherein the connection calculator is at least one connection calculator each further comprising
a first integrator receiving and integrating an input signal from the level shifter system and sending a first integrated output signal;

a second integrator receiving and integrating the first integrated output signal and the second integrator clipping the integrated signal to form a second integrated output signal; and a summation system for receiving and adding the first integrated output signal and the second integrated output signal to form the order of the usage of the components.

25. The ADC chip according to claim 24, wherein the first integrator and the second integrator separately clip the input signal.

26. The ADC chip according to claim 24, wherein the connection calculator is a rule-based connection calculator in which lowest values from the first integrated output signal are first designated in the order of the usage of the components and lowest values from the second integrated output signal are secondly designated in the order of the usage of the components.

27. A method of operating a dynamic element matching ("DEM") system with two or more power supplies, comprising the steps of:

operating a connection calculator at one voltage provided by one power supply wherein the connection calculator calculates an order of usage of components;

operating a connection system at another voltage provided by another power supply wherein the connection system is coupled to the connection calculator and is able to couple to components that are to be matched and equalized in usage by ordering outputs to the components and activating the components according to the ordered outputs; and level shifting, by a level shifter system, voltage levels of signals from the connection calculator to the connection system.

28. The method according to claim 27, further comprising the step of:

level shifting, by another level shifter system, voltage levels of signals from the connection system to the connection calculator.

* * * * *